US008513584B2

(12) United States Patent
Clark et al.

(10) Patent No.: US 8,513,584 B2
(45) Date of Patent: Aug. 20, 2013

(54) PHOTOVOLTAIC ARRAY WITH ANGULAR ADJUSTMENT

(75) Inventors: Stephan R. Clark, Albany, OR (US); Karl S. Weibezahn, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 918 days.

(21) Appl. No.: 12/637,586

(22) Filed: Dec. 14, 2009

(65) Prior Publication Data

US 2011/0139217 A1   Jun. 16, 2011

(51) Int. Cl.
*G01C 21/02* (2006.01)
*H02N 6/00* (2006.01)
*F24J 2/46* (2006.01)

(52) U.S. Cl.
USPC .................. 250/203.4; 136/245; 126/627

(58) Field of Classification Search
USPC ............. 250/203.4; 126/573, 572, 600, 624, 126/627, 682–686, 701, 702, 704; 136/206, 136/214, 215, 230, 244, 245, 246
See application file for complete search history.

(56) References Cited

U.S. PATENT DOCUMENTS

| 4,056,309 | A |   | 11/1977 | Harbison et al. |
|---|---|---|---|---|
| 4,103,672 | A |   | 8/1978 | Meyer |
| 4,149,523 | A |   | 4/1979 | Boy-Marcotte et al. |
| 4,228,789 | A |   | 10/1980 | Kay |
| 4,237,864 | A |   | 12/1980 | Kravitz |
| 4,316,448 | A |   | 2/1982 | Dodge |
| 4,636,579 | A | * | 1/1987 | Hanak et al. .............. 136/246 |
| 5,253,637 | A |   | 10/1993 | Maiden |
| 7,368,656 | B2 |   | 5/2008 | Boulanger |
| 7,569,764 | B2 |   | 8/2009 | Shan |
| 2009/0032090 | A1 |   | 2/2009 | Kats |
| 2009/0114211 | A1 |   | 5/2009 | Homyk |

FOREIGN PATENT DOCUMENTS

JP   55-130070   8/1980

* cited by examiner

*Primary Examiner* — Georgia Y Epps
*Assistant Examiner* — Don Williams (57) ABSTRACT

Apparatus are provided for use in photovoltaic systems. A photovoltaic array includes a rigid transparent material supporting a flexible material there beneath. Numerous photovoltaic cells are supported by the flexible material and are electrically coupled to circuit pathways borne there on. A positioner operates to shift the flexible material thus adjusting respective angular relationships between the photovoltaic cells and the overlying transparent material. Photovoltaic cells are reoriented in accordance with daily or seasonal variations in the suns position by way of the present teachings.

14 Claims, 6 Drawing Sheets

PHOTOVOLTAIC ARRAY WITH ANGULAR ADJUSTMENT

BACKGROUND

Renewable energy resources are being applied to an expanding scope of devices and systems. One such resource is photovoltaic power, wherein photovoltaic cells derive electrical energy directly from incident sunlight. Photovoltaic cells must be positioned normal to the incident rays of sunlight in order to maximize their electrical output.

The sun varies in its angular position above the horizon each day in accordance with an annual cycle. The angular orientation of a photovoltaic cell or array of cells must be correspondingly adjusted so as to achieve the greatest possible electrical yield. The present teachings are directed to these concerns.

BRIEF DESCRIPTION OF THE DRAWINGS

The present embodiments will now be described, by way of example, with reference to the accompanying drawings, in which.

DETAILED DESCRIPTION

Introduction

Means for positioning photovoltaic cells are provided by the present teachings. A photovoltaic array includes a rigid transparent material supporting a flexible material there beneath. Numerous photovoltaic cells are supported by the flexible material and are electrically coupled to circuit pathways formed upon or otherwise supported by the flexible material. A positioner operates to shift the flexible material so as to adjust respective angular relationships between the photovoltaic cells and the overlying transparent material. Photovoltaic cells are reoriented in accordance with daily or seasonal variations in the position of the sun by way of the present teachings.

In one embodiment, an apparatus includes a rigid transparent material, and a flexible material supported by the rigid transparent material. The apparatus also includes a plurality of photovoltaic cells supported by the flexible material. The apparatus further includes a positioner coupled to the flexible material. The positioner is configured to flex the flexible material so as to adjust respective angular relationships between the photovoltaic cells and the rigid transparent material.

In another embodiment, a system includes one or more photovoltaic arrays. Each photovoltaic array includes a plurality of photovoltaic cells supported by a flexible material. Each photovoltaic array also includes a positioner that is configured to flex the flexible material so as to adjust respective angular relationships between the photovoltaic cells and light incident to the photovoltaic array. The system also includes power conditioning circuitry that is coupled to receive electrical energy from the one or more photovoltaic arrays. The power conditioning circuitry is further configured to condition at least one characteristic of the received electrical energy.

Illustrative Operating Environment

Figure 1:
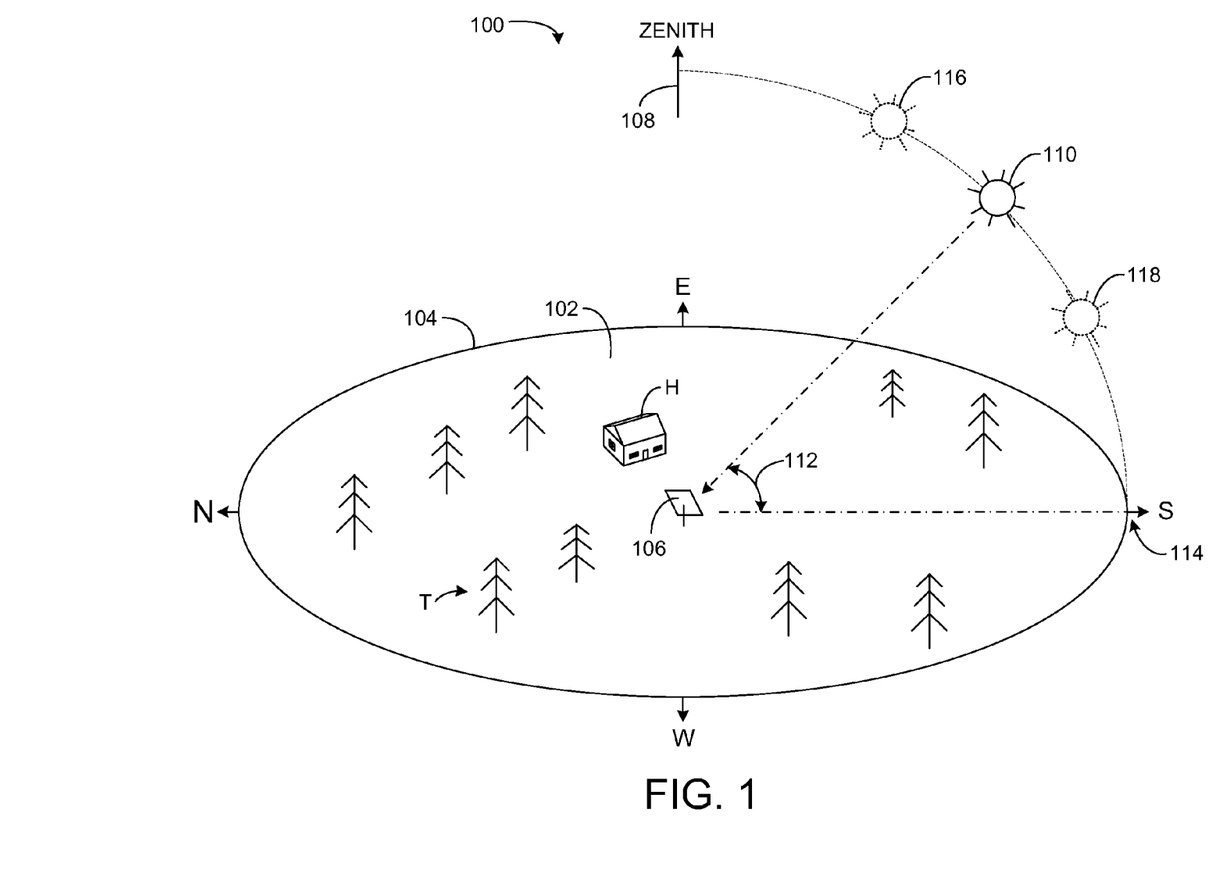
FIG. 1 depicts a perspective view of an operating environment corresponding to the present teachings.

Reference is now made to FIG. 1, which depicts a diagrammatic view of an illustrative operating environment 100 according to the present teachings. The environment 100 is non-limiting in nature and is provided to clarify aspects of the present teachings. Thus, other operating environments are also contemplated by the present teachings.

The environment 100 includes a terrestrial area 102 defined by a horizon line 104. For purposes of non-limiting illustration, it is assumed that the terrestrial area 102 and the horizon line 104 correspond to an arbitrary location at forty-five degrees north latitude. Environments corresponding to other locations at other latitudes (north or south) can also be used. The terrestrial area 102 includes a house "H" and trees "T" in the interest of context, but which are not essential to an understanding of the present teachings.

The environment 100 includes a solar array 106. The solar array 106 is understood to include numerous photovoltaic cells supported on a planar substrate. The horizon line 104 is the apparent horizon relative to and circumscribing the solar array 106. Thus, the solar array 106 is centered within the surrounding horizon line 104. Zenith relative to the solar array 106 is indicated by the directional arrow 108.

The environment 100 includes the apparent location of the sun 110 relative to the solar array 106 at solar noon during an equinox (spring or fall). As depicted, the sun 110 appears at an angle 112 above the southern cardinal compass point 114 on the horizon line 104. Also depicted are the apparent location of the sun 116 during the summer solstice and the apparent location of the sun 118 during the winter solstice.

The angular relationship 112 between the solar array 106 and the apparent location of the sun at solar noon varies in accordance with an annual cycle between extremes at 116 and 118. Additionally, the solar array 106 must be tilted so that sunlight will strike the photovoltaic cells at an angle normal thereto (i.e., at ninety degrees) in order to achieve maximum electrical production. As a result, the tilt angle of the solar array 106 must be adjusted periodically in order to compensate for seasonal variations in the angle 112. Furthermore, angular adjustments to the solar array 106 must also be made throughout each day in order to correct for the suns changing apparent position while rising in the east, traversing across the sky and setting in the west. Suboptimal electrical yield will result without such angular adjustments to the solar array 106.

First Illustrative Embodiment

Figure 2A:
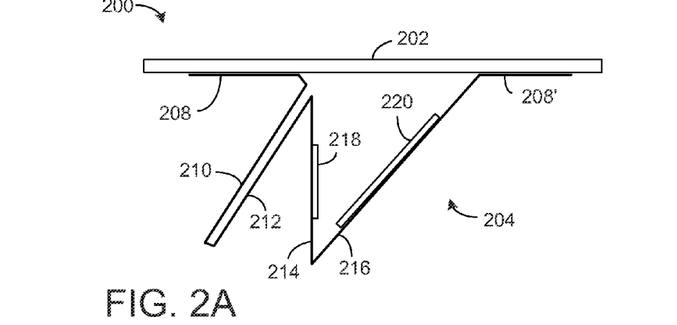
FIG. 2A depicts an elevation view of a solar device according to one embodiment.
Figure 2B:
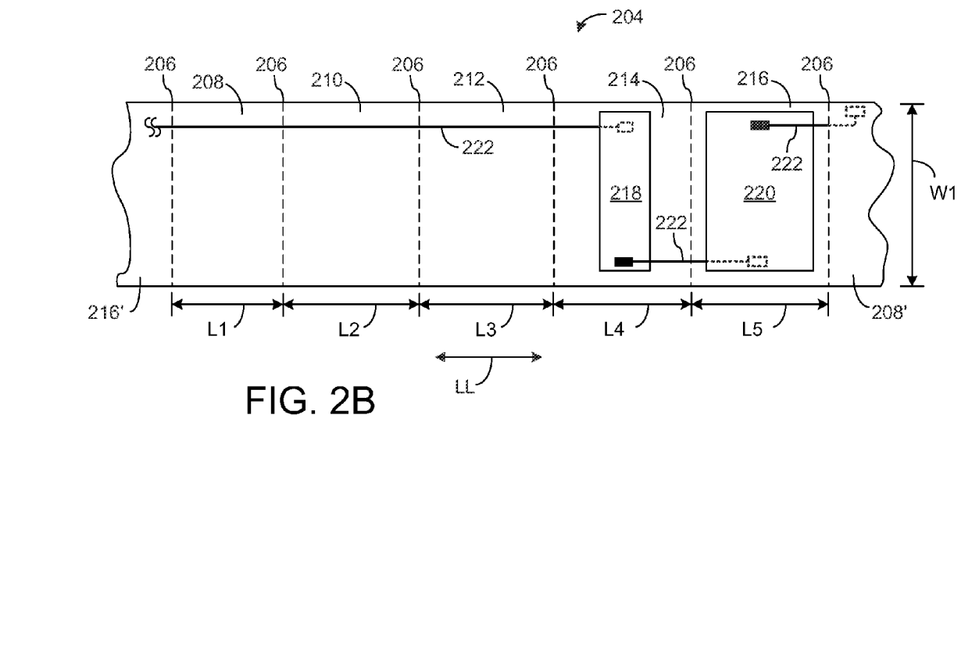
FIG. 2B depicts a plan view of a portion of the solar device of FIG. 2A.

Attention is now directed to FIGS. 2A and 2B, which depict respective aspects of a solar device (device) 200 according to one embodiment. Specifically, FIG. 2A is an elevation view of the device 200, while FIG. 2B is plan view of portions of the device 200. The device 200 is illustrative and non-limiting with the respect to the present teachings. Other embodiments can also be configured and used according to the present teachings.

The device 200 includes a rigid transparent material 202. The rigid transparent material 202 is depicted in a side elevation view. Non-limiting examples of rigid transparent material 202 include glass, and plastic. The rigid transparent material 202 is sheet-like in form and is configured to readily pass light incident thereto. The device 200 also includes a flexible material 204. Non-limiting examples of flexible material 204 include Mylar (i.e., PEN, PET, etc.).

The flexible material 204 is electrically non-conductive and sheet- or strip-like in form. The flexible material 204 can be comprised of one or more layers of suitable constituency. In one embodiment, the flexible material 204 is defined by a strip of Mylar having a thickness of three-to-seven mils (three-to-seven thousandths of an inch).

The flexible material 204 is defined by a width "W1" and by a plurality of fold lines (or regions) 206. The fold lines 206 can be formed by any suitable means such as, for non-limiting example, partial laser ablation, mechanical perforation or compression, etc. The fold lines 206 are arranged across the width-wise dimension "W1" of the flexible material 204 such that distinct areas 208, 210, 212, 214 and 216, inclusive, are defined. The areas 208-216 are also defined by length-wise dimensions L1, L2, L3, L4 and L5, respectively.

Additionally, portions of areas 208' and 216' are also depicted that are dimensionally identical to areas 208 and 216, respectively. The areas 208 and 208' are bonded to the rigid transparent material 202 by way of thermal bonding, epoxy, mechanical fasteners (not shown) or other suitable means.

The solar device 200 includes a photovoltaic cell (PV) 218 and a photovoltaic cell 220. The photovoltaic cells 218 and 220 can be any respective and suitable PV cells configured to derive (i.e., generate, or produce) electrical energy in response to incident light. In one embodiment, the PV cell 220 is configured to produce optimum electrical output in response to relatively low-energy photonic exposure, such as sunlight in or near the infra-red region of the spectrum. In turn, the PV cell 218 is configured to optimize electrical output in response to mid-energy photons, such as sunlight within the visible region of the spectrum. Other PV cell 218 or 220 having respectively varying performance characteristics can also be used.

The PV cell 218 is bonded to and supported by the area 214 of the flexible material 204. In turn, the PV cell 220 is bonded to and supported by the area 216 of the flexible material 204. The solar device 200 further includes a plurality of flexible electrical traces or circuit pathways 222. The electrical circuit pathways 222 are formed of any suitable electrically conductive material such as, for non-limiting example, copper, aluminum, silver, gold, etc. Other suitable materials can also be used. The electrical circuit pathways 222 are bonded to or formed upon either or both sides of the flexible material 204.

The electrical circuit pathways 222 are configured to electrically couple the PV cells 218 and 220 to each other, to other PV cells of the solar device 200 (not shown) and to entities external to the solar device 200. One of ordinary skill in the electrical arts can appreciate that circuit traces, through vias and other techniques can be used to form and define the electrical circuit pathways 222, and that further elaboration is not required for an understanding of the present teachings.

It is noted that the fold lines 206, the resulting areas 208-216, the PV cells 218 and 220, and the electrical circuit pathways 222 define a pattern that can be repeated any suitable number of times along a lengthwise aspect "LL" of a strip of flexible material 204. In this way, the present teachings contemplate the use of roll materials and related manufacturing techniques in order to fabricate solar devices 200 of respectively varying dimensions and electrical generating capacities. As such, respective solar devices 200 can be constructed and configured to include any suitable number of PV cells (e.g., 218 and 220, etc.) that are electrically coupled to define a solar array. Such a solar array can be electrically coupled to external electronic entities as illustrated in further detail hereinafter.

First Illustrative Operation

Figure 2C:
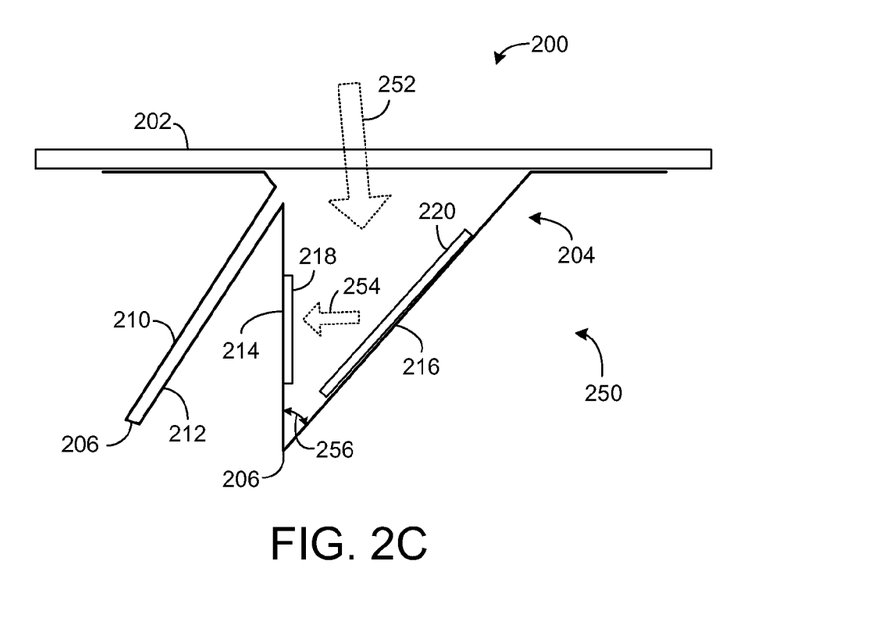
FIG. 2C depicts an elevation view of the solar device of FIG. 2A in a first operational state.

Attention is now turned to FIG. 2C, which depicts an elevation view of the solar device 200 in a first illustrative operating state 250. Sunlight or other illumination 252 having broad-spectrum photonic content is incident to the device 200. The sunlight 252 passes though the rigid transparent material 202 and strikes the PV cell 220. Relatively low-energy (i.e., infrared, etc.) photons are absorbed by the PV cell 220. Higher energy photons are reflected as rays 254 onto the PV cell 218. In this way, generally maximized use is made of the spectral content of the sunlight (or other illumination) 252.

It is noted that the areas 214 and 216 of the flexible material 204 are disposed at an angle 256 to each other. The device 200 is configured such that this angle 256 is substantially fixed (i.e., constant) and is maintained despite flexure of the flexible material 204 during normal operation of the solar device 200. In one embodiment, the angle 256 is defined by forty-five degrees of arc. Other suitable angular relationships 256 can also be used.

Figure 2D:
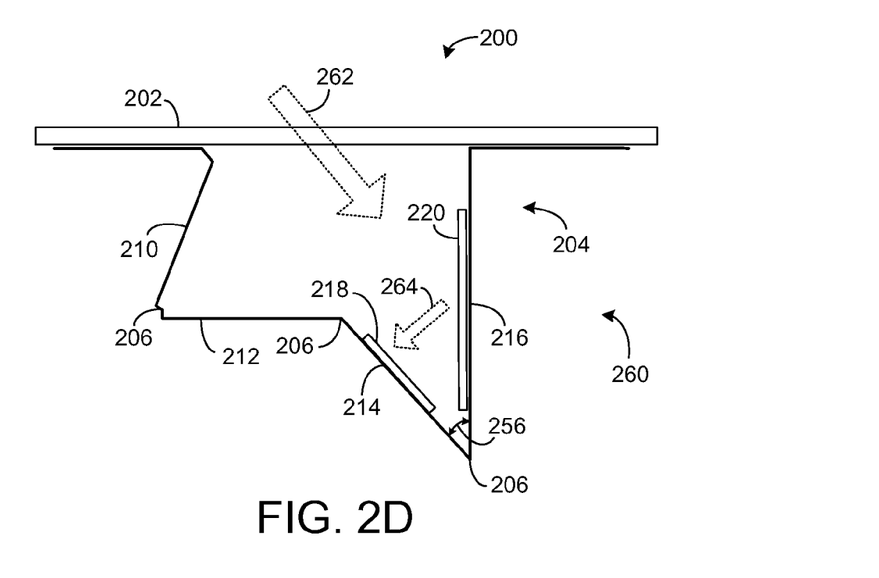
FIG. 2D depicts an elevation view of the solar device of FIG. 2A in a second operational state.

Attention is now turned to FIG. 2D, which depicts an elevation view of the solar device 200 in a second illustrative operating state 260. Sunlight 262 having broad-spectrum photonic content is incident to the device 200. It is noted that the sunlight 262 is at a more acute angle of incidence to the device 200, relative to the sunlight 252 of FIG. 2C. The sunlight 262 passes though the rigid transparent material 202 and strikes the PV cell 220. Relatively low-energy photons are absorbed by PV cell 220 and higher energy photons are reflected as rays 264 onto the PV cell 218.

It is noted that the angle 256 is preserved between the areas 214 and 216 and thus also the respective PV cells 218 and 220. It is further noted that the orientation 260 of the device 200 is achieved through flexure of the flexible material 204 along respective fold lines (regions) 206 such that the areas 210-216, and elements supported thereon, are displaced relative to their respective positions in orientation 250.

Two illustrative orientations 250 and 260 of the device 200 are depicted in the interest of understanding the present teachings. However, it is to be understood that the flexible material 204 can be flexed—that is, displaced—discretely or continuously to any number of orientations within some predetermined operating range. Such an operating range can be selected by way of dimensional parameters of the flexible material 204 and other elements of the solar device 200.

Such flexed operation of the solar device 200 serves to generally optimize use of the spectral content of the sunlight (or other illumination) 262. The solar device 200 can be used, temporarily or permanently, with a constant angular relationship between the rigid transparent material 204 and the surrounding horizon (e.g., 104). Normal operation of the solar device 200 accommodates daily or seasonal variations in the suns apparent angular position (e.g., 112) by way of flexing the flexible material 204. Flexure of the flexible material 204 can be performed by way of positioner means of the present teachings described hereinafter.

Table 1 below provides illustrative and non-limiting dimensions and characteristics for the illustrative solar device 200:

TABLE 1

Illustrative Device 200

| Element | Description/Notes |
|---|---|
| Rigid Trans. Mat. 202 | Glass, 30 mm by 20 mm by 1 mm thick |
| Flexible Mat. 204 | Mylar, 30 mm by 68.31 mm by 0.07 mm thick |
| PV Cell 218 | 25 mm by 4 mm by 0.6 mm thick |
| PV Cell 220 | 25 mm by 16.3 mm by 0.6 mm thick |
| Area 208 | 5.11 mm length "L1" |
| Area 210 | 15.4 mm length "L2" |
| Area 212 | 13.9 mm length "L3" |
| Area 214 | 13.0 mm length "L4" |
| Area 216 | 20.9 mm length "L5" |

Second Illustrative Embodiment

Figure 3:
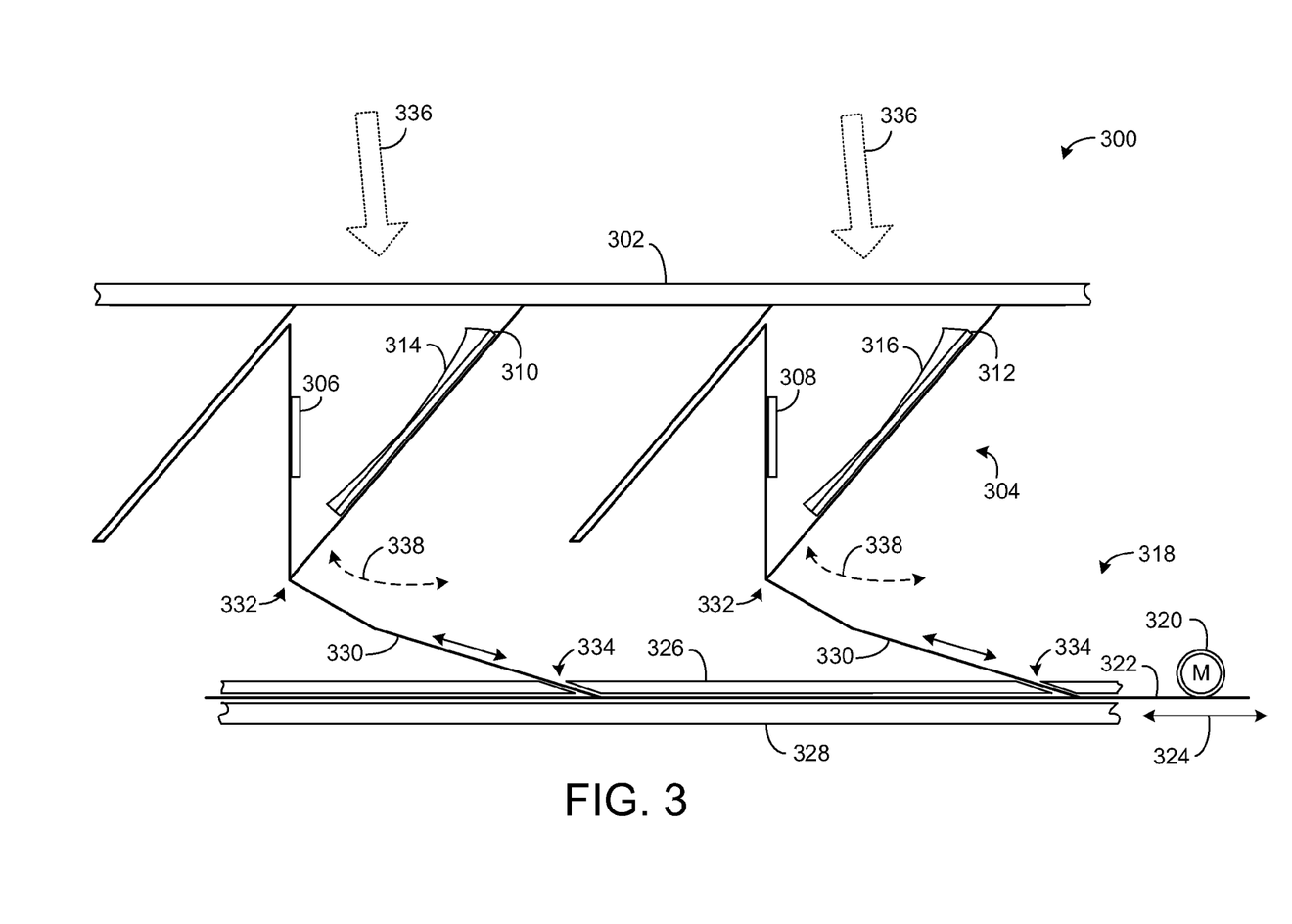
FIG. 3 depicts an elevation view of a solar device according to one embodiment.

Attention is now directed to FIG. 3, which depicts an elevation view of aspects of a solar device 300 according to one embodiment. The solar device 300 is illustrative and non-limiting in nature. Thus, other solar devices can also be configured and used in accordance with the present teachings.

The device 300 includes a rigid transparent material 302 and a flexible material 304 that are defined and configured substantially as described above in regard to the rigid transparent material 202 and a flexible material 204, respectively. The device 300 also includes low-energy PV cells 310 and 312, and mid-energy PV cells 306 and 308 that are respectively configured and operative as described above. The PV cells 306-312, inclusive, are supported on respective areas of the flexible material 304.

The device 300 further includes light concentrating elements 314 and 316, which are disposed (i.e., bonded) in cooperative orientation with the low-energy PV cells 310 and 312, respectively. Each of the light concentrating elements 314 and 316 can be defined by a suitable glass lens, a Fresnel lens, a reflective trough, or other structure configured to concentrate photonic energy incident to the PV cells 310 and 312, respectively.

The solar device 300 also includes a positioner 318. The positioner 318 includes a wheel (or gear) and motor combination (motor) 320. The motor 320 is understood to be actuated by an appropriate controller (not shown). The motor 320 is mechanically engaged to a positioning belt (belt) 322. The belt 322 is configured to be bidirectionally translated within a linear range as indicated by the arrow 324. The positioner 318 also includes an upper guide plate 326 and a lower guide plate 328. The belt 322 is disposed between the upper guide plate 326 and the lower guide plate 328 and is configured to be linearly displaced (positioned) by way of the motor 320.

The positioner 318 also includes a number of extensions 330. The extensions 330 are also referred to as mechanical couplings for purposes herein. Each of the extensions 330 is defined by a strip of semi-rigid material that is coupled to the belt 322 at one end, and to a respective fold line (or region) 332 of the flexible material 304 at the other end. Each of the extensions 330 is routed by way of a corresponding through aperture 334 defined by the upper guide plate 326. Thus, the range of motion of each extension 330 is constrained or defined, in part, by the corresponding through aperture 334.

Normal illustrative operation of the device 300 is as follows: sunlight 336 (or other illumination) is incident to the device 300 and passes through the rigid transparent material 302, striking the light concentrators 314 and 316 and is concentrated on the PV cells 310 and 312, respectively. Some of the light 336 (e.g., mid-energy content) is reflected onto PV cells 306 and 308.

The PV cells 306-312, inclusive, are positioned at optimum angles to the incoming light 336 by way of the flexible material 304. As the angle of incidence of the sunlight 336 varies over the course of a day or the seasons, the motor 320 operates to reposition the belt 322 accordingly. In turn, the extensions 330 couple the linear motion of the belt 322 to the flexible material 304 at the respective fold lines 332. The flexible material is then flexed—or angularly displaced—as shown by arrowed arcs 338. The PV cells 306-312 are thus repositioned in response to the changing angle of incidence of the sunlight 336 so that maximum electrical yield is achieved.

The operation described immediately above is largely attributable to the controllably flexed, accordion-like behavior of the flexible material 304. It is noted that a total of four PV cells are depicted in FIG. 3—namely, PV cells 306, 308, 310 and 312, respectively. However, it is to be understood that other solar devices supporting other respective numbers (e.g., six, ten, twenty, etc.) of photovoltaic cells can also be used in accordance with the present teachings. The present teachings contemplate no particular upward limit as to the size of a photovoltaic array that can be supported by flexible material that is repositioned by mechanical means so as to reorient the PV cells with respect to incident sunlight or other illumination.

Third Illustrative Embodiment

Figure 4A:
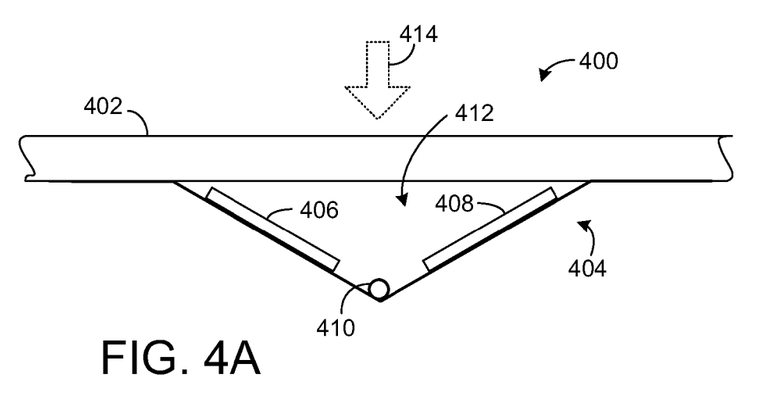
FIG. 4A depicts an elevation view of another solar device according to a first operational state.
Figure 4B:
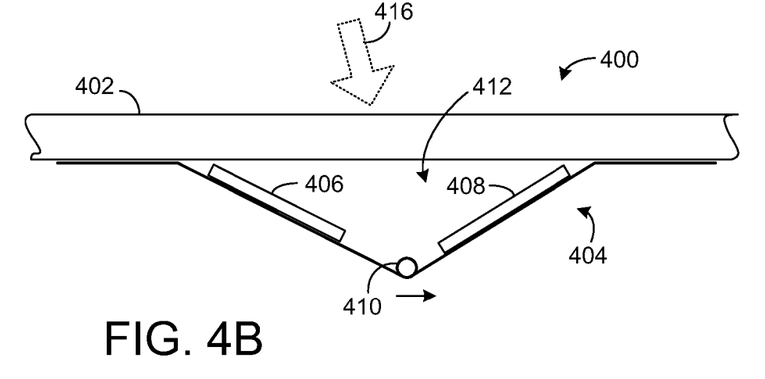
FIG. 4B depicts an elevation view of the solar device of FIG. 4A in a second operational state.
Figure 4C:
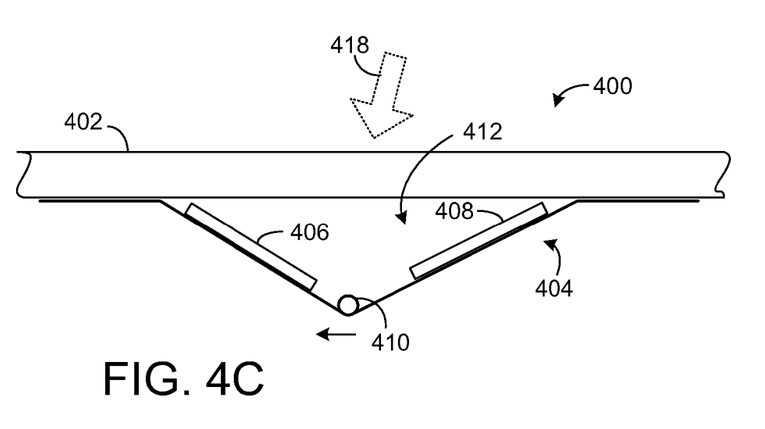
FIG. 4C depicts an elevation view of the solar device of FIG. 4A in a third operational state.

Reference is now made to FIGS. 4A-4C which depict elevation views of a solar device 400 in a first, second and third operational state, respectively. The device 400 is illustrative and non-limiting in nature. Thus, other solar devices can also be configured and used in accordance with the present teachings.

The device 400 includes a rigid transparent material 402 such as, for non-limiting example, glass, plastic,. The device 400 further includes a strip of flexible material 404 supported generally beneath the rigid transparent material 402. The flexible material 404 can be, for non-limiting example, Mylar or other plastic sheeting, etc. The device 400 also includes respective PV cells 406 and 408 that are bonded to and supported by the flexible material 404.

The solar device 400 further includes a roller 410. The roller can be formed from any suitable, generally rigid material such as plastic, rubber, etc. The roller 410 is in contact with a portion of the flexible material 404 such that a trough 412 is defined. The PV cells 406 and 408 are supported on respective, generally inward-facing sides of the trough 412. The roller 410 exerts an urging force that keeps the flexible material 404 in a taught condition.

FIG. 4A depicts the solar device 400 in a first operating state in which the roller 410 is generally centered within the trough 412 as defined by the flexible material 404. This condition is suitable, for non-limiting example, when sunlight 414 is incident to the device 400 at about a ninety degree angle (normal to the device 400).

FIG. 4B depicts the solar device 400 in a second operating state in which the roller 410 shifted to the right of center, thus displacing the lean or angular disposition of the trough 412. This condition is suitable, for non-limiting example, when sunlight 416 is incident to the device 400 from a generally leftward overlying position.

FIG. 4C depicts the solar device 400 in a third operating state in which the roller 410 shifted to the left of center, causing a different angular disposition of the trough 412. This condition is suitable, for non-limiting example, when sunlight 418 is incident to the device 400 from a generally rightward overlying position.

The roller 410 operates to flex or displace the flexible material 404 so as to alter the angular shift of the trough 412. In turn, the PV cells 406 and 408 are shifted in their angular relationships with the overlying rigid material 402 and sunlight (illumination) incident thereto. The roller 410 is assumed to be positioned by a suitable mechanical assembly and controller, not shown. One having ordinary skill in the control arts will appreciate that numerous configurations of mechanical assemblies and controllers can be used in association with the roller 410.

In this way, the present teachings contemplate any number of embodiments wherein flexible material is used to support any suitable number of photovoltaic cells as an array. The array can be readily reoriented with respect to an illumination source by way of a corresponding number of rollers.

First Illustrative System

Figure 5:
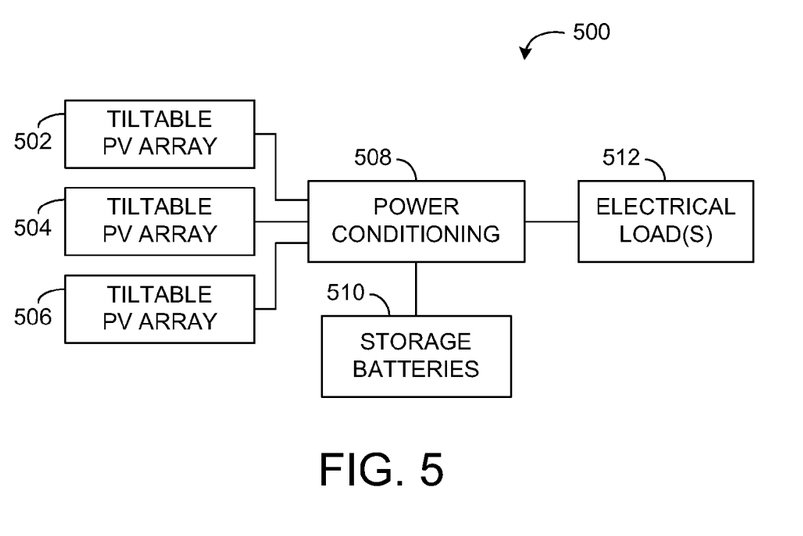
FIG. 5 depicts block diagram of a system according to one embodiment.

FIG. 5 is an elevation diagram of a system 500 according to another embodiment. The system 500 is illustrative and non-limiting in nature. Other systems can be defined, configured and used in accordance with the present teachings.

The system 500 includes a plurality of tiltable photovoltaic arrays 502, 504 and 506, respectively. Each of the tiltable PV arrays 502-506 can be defined by, or include, the solar devices 200, 300 or 400 as described above. As such, each tiltable PV array 502-506 includes some respective number of PV cells that are supported on a flexible material. In turn, the flexible material(s) are flexed or reoriented so that desired angular relationships between the PV cells and incident light can be established or maintained.

The system 500 includes power conditioning circuitry (circuitry) 508. The circuitry 508 is configured to receive electrical energy derived by the tiltable PV arrays 502-506 and to condition at least one characteristic of that energy. Non-limiting examples of such conditioning include direct-current (DC) voltage regulation, current limiting, battery charging operations, alternating-current (AC) voltage synthesis, etc. Other electrical operations can also be performed by the circuitry 508. One having ordinary skill in the electrical arts is familiar with power conditioning circuitry used in association with photovoltaic systems, and further elaboration is not required for purposes of understanding the present teachings.

The system 500 further includes one or more storage batteries 510. The storage batteries 510 can include any suitable number or type of storage batteries. Non-limiting examples of such batteries include lead acid, gel-cell, lithium ion, etc. Other batteries 510 can also be used. In the alternative, the storage batteries 510 can be defined by an array of super- or ultra-capacitors. The storage batteries 510 are configured to receive and store electrical energy produced by the tiltable PV arrays 502-506 by way of the circuitry 508. The storage batteries 510 are further configured to provide stored electrical energy to the circuitry 508.

The system 500 further includes one or more electrical loads 512. The electrical loads 512 can be defined by any suitable device(s) or system(s) requiring electrical power for normal operations. Non-limiting examples of such electrical loads 512 include cellular communications equipment, computers, refrigeration or heating systems, shortwave or other radio communications gear, consumer electronics, printing or imaging equipment, etc. Other electrical loads 512 can also be used. The electrical loads 512 are coupled to receive operating level electrical energy from the power conditioning circuitry 508.

In accordance with the present teachings, and without limitation, various solar devices can be defined and configured having photovoltaic cells supported by a flexible material. Flexible circuit pathways bonded to or formed upon the flexible material electrically couple the respective PV cells to each other and to external circuitry. A positioner alters the flexed condition or shape of the flexible material so as to establish or maintain a suitable angular orientation between the PV cells and incident sunlight. Electrical energy can be drawn from the PV cells and conditioned, stored or used to operate various electrical load devices. In one or more embodiments, roll manufacturing processes are exploited during fabrication of the solar device. Economical production of photovoltaic arrays having angular orientation control is thus contemplated by the present teachings.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   a rigid transparent material;
   a flexible material supported by the rigid transparent material;
   a plurality of photovoltaic cells supported by the flexible material; and
   a positioner coupled to the flexible material, the positioner configured to flex the flexible material so as to adjust respective angular relationships between the photovoltaic cells and the rigid transparent material wherein the positioner is configured to flex the flexible materal in accordance with an angular position of the sun with respect to the photovoltaic cells.

2. The apparatus according to claim 1, the apparatus configured such that incident light passes through the rigid transparent material before striking the photovoltaic cells.

3. The apparatus according to claim 1, the flexible material characterized by a plurality of fold lines, the positioner coupled to the flexible material along at least one of the fold lines.

4. The apparatus according to claim 3, the positioner including a belt portion configured to be translated within a linear range, the belt portion coupled to the at least one fold line of the flexible material by way of at least one extension portion.

5. The apparatus according to claim 1, the flexible material being non-electrically conductive.

6. The apparatus according to claim 1 further comprising a plurality of electrical circuit pathways supported by the flexible material, the electrical circuit pathways configured to electrically couple the photovoltaic cells to one or more other entities.

7. The apparatus according to claim 1 further comprising one or more light concentrating elements disposed in cooperative orientation to one or more of the photovoltaic cells.

8. The apparatus according to claim 1, the flexible material configured to define a first region and a second region adjacent to the first region, the first and second regions configured to support first and second photovoltaic cells at a constant angular relationship to each other.

9. The apparatus according to claim 8, the flexible material further configured to maintain the constant angular relationship during flexing of the flexible material by the positioner.

10. The apparatus according to claim 1, the positioner including at least one roller configured to be repositioned while in contact with the flexible material.

11. The apparatus according to claim 10, the at least one roller being in contact with the flexible material between two adjacent ones of the photovoltaic cells, the respective angular relationships between the two adjacent photovoltaic cells and the rigid transparent material being adjustable by way of the at least one roller.

12. A system, comprising:
one or more photovoltaic arrays each including a plurality of photovoltaic cells supported by a flexible material, each photovoltaic array including a positioner configured to flex the flexible material so as to adjust respective angular relationships between the photovoltaic cells and light incident to the photovoltaic array; and
power conditioning circuitry coupled to receive electrical energy from the one or more photovoltaic arrays, the power conditioning circuitry configured to condition at least one characteristic of the received electrical energy, wherein each positioner is configured to flex the corresponding flexible materal in accordance with an angular position of the sun with respect to the corresponding photovoltaic array.

13. The system according to claim 12 further comprising at least one storage battery configured to store electrical energy received from the one or more photovoltaic arrays by way of the power conditioning circuitry.

14. The system according to claim 12 further comprising at least one load device coupled to receive operating electrical power originating from the one or more photovoltaic arrays.

* * * * *

UNITED STATES PATENT AND TRADEMARK OFFICE
CERTIFICATE OF CORRECTION

PATENT NO. : 8,513,584 B2
APPLICATION NO. : 12/637586
DATED : August 20, 2013
INVENTOR(S) : Stephan R. Clark et al.

It is certified that error appears in the above-identified patent and that said Letters Patent is hereby corrected as shown below:

In the Claims:

In column 8, line 41, in Claim 1, delete "materal" and insert -- material --, therefor.

In column 10, line 9, in Claim 12, delete "materal" and insert -- material --, therefor.

Signed and Sealed this
Twelfth Day of November, 2013

Teresa Stanek Rea
*Deputy Director of the United States Patent and Trademark Office*